United States Patent
Tabrizi (10) Patent No.: US 8,809,116 B2
(45) Date of Patent: Aug. 19, 2014

(54) METHOD FOR WAFER LEVEL PACKAGING OF ELECTRONIC DEVICES

(75) Inventor: Behnam Tabrizi, Harvard, MA (US)

(73) Assignee: Skyworks Solutions, Inc., Woburn, MA (US)

( * ) Notice: Subject to any disclaimer, the term of this patent is extended or adjusted under 35 U.S.C. 154(b) by 98 days.

(21) Appl. No.: 13/599,284

(22) Filed: Aug. 30, 2012

(65) Prior Publication Data

US 2012/0322206 A1    Dec. 20, 2012

Related U.S. Application Data

(62) Division of application No. 12/740,922, filed as application No. PCT/US2008/068106 on Jun. 25, 2008, now Pat. No. 8,324,728.

(60) Provisional application No. 60/991,469, filed on Nov. 30, 2007.

(51) Int. Cl.
| | |
|---|---|
| *H01L 21/44* | (2006.01) |
| *H01L 21/48* | (2006.01) |
| *H01L 23/00* | (2006.01) |
| *H01L 23/10* | (2006.01) |
| *H01L 23/13* | (2006.01) |
| *H01L 23/498* | (2006.01) |
| *H01L 23/66* | (2006.01) |
| *H01L 23/14* | (2006.01) |
| *H01L 23/055* | (2006.01) |
| *H01L 25/16* | (2006.01) |

(52) U.S. Cl.
CPC ....... *H01L 23/13* (2013.01); *H01L 2924/15165* (2013.01); *H01L 2224/48091* (2013.01); *H01L 2224/48235* (2013.01); *H01L 2924/15153* (2013.01); *H01L 2224/81894* (2013.01); *H01L 24/16* (2013.01); *H01L 2924/01031* (2013.01); *H01L 23/10* (2013.01); *H01L 2224/48227* (2013.01); *H01L 2224/73257* (2013.01); *H01L 2924/3011* (2013.01); *H01L 24/48* (2013.01); *H01L 2224/13144* (2013.01); *H01L 2924/01027* (2013.01); *H01L 2224/81801* (2013.01); *H01L 2224/484* (2013.01); *H01L 2924/10329* (2013.01); *H01L 2924/01082* (2013.01); *H01L 23/49827* (2013.01); *H01L 2924/19105* (2013.01); *H01L 2924/01047* (2013.01); *H01L 2924/014* (2013.01); *H01L 2224/73253* (2013.01); *H01L 2224/81205* (2013.01); *H01L 23/66* (2013.01); *H01L 24/81* (2013.01); *H01L 2924/01014* (2013.01); *H01L 2224/8383* (2013.01); *H01L 2924/01074* (2013.01); *H01L 24/73* (2013.01); *H01L 24/12* (2013.01); *H01L 23/147* (2013.01); *H01L 2924/01005* (2013.01); *H01L 2924/01029* (2013.01); *H01L 2224/32145* (2013.01); *H01L 2924/19041* (2013.01); *H01L 2224/16225* (2013.01); *H01L 2924/01033* (2013.01); *H01L 23/055* (2013.01); *H01L 2924/10253* (2013.01); *H01L 2924/01079* (2013.01); *H01L 2224/73265* (2013.01); *H01L 2924/3025* (2013.01); *H01L 2924/14* (2013.01); *H01L 2924/0102* (2013.01); *H01L 2924/01049* (2013.01); *H01L 2924/01006* (2013.01); *H01L 2224/13147* (2013.01); *H01L 2924/01015* (2013.01); *H01L 25/165* (2013.01); *H01L 2224/13099* (2013.01)
USPC ........................ 438/108; 438/667; 257/E21.5

(58) Field of Classification Search
USPC ................................ 438/108, 667; 257/E21.5
See application file for complete search history.

(56) References Cited

U.S. PATENT DOCUMENTS

| | | | |
|---|---|---|---|
| 5,323,051 A | 6/1994 | Adams et al. | |
| 5,448,014 A | 9/1995 | Kong et al. | |
| 5,757,072 A | 5/1998 | Gorowitz et al. | |
| 5,798,557 A | 8/1998 | Salatino et al. | |
| 5,990,768 A * | 11/1999 | Takahashi et al. | 333/247 |
| 6,057,597 A | 5/2000 | Farnworth et al. | |
| 6,140,144 A * | 10/2000 | Najafi et al. | 438/53 |
| 6,207,477 B1 | 3/2001 | Motooka et al. | |
| 6,214,644 B1 | 4/2001 | Glenn | |
| 6,228,675 B1 | 5/2001 | Ruby et al. | |
| 6,297,072 B1 | 10/2001 | Tilmans et al. | |
| 6,297,551 B1 | 10/2001 | Dudderar et al. | |
| 6,358,773 B1 | 3/2002 | Lin et al. | |
| 6,376,280 B1 | 4/2002 | Ruby et al. | |
| 6,380,616 B1 | 4/2002 | Tutsch et al. | |
| 6,399,426 B1 | 6/2002 | Capote et al. | |
| 6,402,970 B1 | 6/2002 | Lin | |
| 6,498,114 B1 | 12/2002 | Amundson et al. | |
| 6,504,096 B2 | 1/2003 | Okubora | |
| 6,522,762 B1 | 2/2003 | Mullenborn et al. | |
| 6,530,515 B1 | 3/2003 | Glenn et al. | |
| 6,559,530 B2 | 5/2003 | Hinzel et al. | |
| 6,566,745 B1 | 5/2003 | Beyne et al. | |
| 6,624,508 B2 | 9/2003 | Koh | |
| 6,630,725 B1 | 10/2003 | Kuo et al. | |
| 6,660,564 B2 | 12/2003 | Brady | |
| 6,674,159 B1 | 1/2004 | Peterson et al. | |
| 6,743,656 B2 | 6/2004 | Orcutt et al. | |
| 6,743,991 B1 | 6/2004 | Wong et al. | |
| 6,750,521 B1 | 6/2004 | Chilcott et al. | |
| 6,767,764 B2 | 7/2004 | Saia et al. | |
| 6,777,263 B1 | 8/2004 | Gan et al. | |
| 6,787,897 B2 | 9/2004 | Geefay et al. | |
| 6,794,739 B2 | 9/2004 | Kobayashi et al. | |
| 6,800,508 B2 | 10/2004 | Kimura | |
| 6,822,324 B2 | 11/2004 | Tao et al. | |
| 6,828,674 B2 | 12/2004 | Karpman | |
| 6,838,309 B1 | 1/2005 | McCann | |
| 6,846,725 B2 | 1/2005 | Nagarajan et al. | |
| 6,858,929 B2 | 2/2005 | Zuo et al. | |
| 6,912,081 B2 | 6/2005 | Bolle et al. | |
| 6,929,974 B2 | 8/2005 | Ding et al. | |
| 6,939,784 B2 | 9/2005 | Chen et al. | |
| 6,953,999 B2 | 10/2005 | Strandberg et al. | |
| 6,955,934 B2 * | 10/2005 | Gallup et al. | 438/27 |
| 7,030,494 B2 | 4/2006 | Aoki | |
| 7,045,459 B2 | 5/2006 | Freidhoff | |
| 7,045,868 B2 | 5/2006 | Ding et al. | |
| 7,059,048 B2 | 6/2006 | Koning et al. | |
| 7,061,099 B2 | 6/2006 | Lu et al. | |
| 7,115,446 B2 | 10/2006 | Koo et al. | |
| 7,166,917 B2 | 1/2007 | Yang et al. | |
| 7,169,649 B2 | 1/2007 | Rosa et al. | |
| 7,198,725 B2 | 4/2007 | Shen | |
| 7,202,560 B2 | 4/2007 | Dungan et al. | |
| 7,203,388 B2 | 4/2007 | Ha et al. | |
| 7,203,394 B2 | 4/2007 | Wiegele et al. | |
| 7,265,429 B2 | 9/2007 | Wan | |
| 7,268,436 B2 | 9/2007 | Aigner et al. | |
| 7,275,424 B2 | 10/2007 | Felton et al. | |
| 7,298,030 B2 | 11/2007 | McWilliams et al. | |
| 7,311,242 B2 | 12/2007 | Six | |
| 7,319,598 B2 | 1/2008 | Steiner et al. | |
| 7,323,675 B2 | 1/2008 | Chen | |
| 7,335,972 B2 | 2/2008 | Chanchani | |
| 7,368,808 B2 | 5/2008 | Heck et al. | |
| 7,456,497 B2 | 11/2008 | Higashi | |
| 7,470,977 B2 | 12/2008 | Okubora | |
| 7,476,955 B2 | 1/2009 | Street et al. | |
| 7,554,167 B2 | 6/2009 | Vaganov | |
| 7,576,426 B2 | 8/2009 | Gan et al. | |
| 7,629,201 B2 | 12/2009 | Gan et al. | |
| 7,635,606 B2 | 12/2009 | Warren et al. | |
| 7,713,841 B2 | 5/2010 | Wood et al. | |
| 8,324,728 B2 | 12/2012 | Tabrizi | |
| 2001/0020879 A1 * | 9/2001 | Takahashi et al. | 333/204 |
| 2002/0017663 A1 * | 2/2002 | Takahashi et al. | 257/245 |
| 2002/0132463 A1 | 9/2002 | Urushima | |
| 2003/0095759 A1 * | 5/2003 | Dautartas et al. | 385/92 |
| 2003/0174383 A1 | 9/2003 | Bolle et al. | |
| 2003/0206083 A1 * | 11/2003 | Takahashi et al. | 333/247 |
| 2004/0063249 A1 | 4/2004 | Lin et al. | |
| 2004/0072071 A1 | 4/2004 | Watanabe et al. | |
| 2004/0178492 A1 | 9/2004 | Tsukamoto et al. | |
| 2004/0259325 A1 | 12/2004 | Gan | |
| 2005/0054133 A1 | 3/2005 | Felton et al. | |
| 2005/0073040 A1 | 4/2005 | Lee et al. | |
| 2005/0139984 A1 | 6/2005 | Tuckerman et al. | |
| 2005/0230692 A1 * | 10/2005 | Kim et al. | 257/79 |
| 2006/0179940 A1 * | 8/2006 | Liu et al. | 73/488 |
| 2006/0211233 A1 | 9/2006 | Gan et al. | |
| 2007/0063129 A1 | 3/2007 | Chen | |
| 2007/0274058 A1 | 11/2007 | Cousin | |
| 2008/0064142 A1 | 3/2008 | Gan et al. | |
| 2008/0217708 A1 | 9/2008 | Reisner et al. | |
| 2010/0025845 A1 | 2/2010 | Merz et al. | |

FOREIGN PATENT DOCUMENTS

| | | |
|---|---|---|
| JP | 2003218256 A | 7/2003 |
| JP | 2006-237406 A | 9/2006 |
| KR | 20030088996 A | 11/2003 |
| TW | 457657 B | 10/2001 |
| WO | 0119142 A1 | 3/2001 |
| WO | 2006065558 A2 | 6/2006 |
| WO | 2008016436 A2 | 2/2008 |

OTHER PUBLICATIONS

Notification of Second Office Action in CN200880118203.3 dated Mar. 3, 2012.

K. C. Eun et al., "Fully Embedded LTCC Spiral Inductors Incorporating Air Cavity for High Q-factor and SRD," IEEE Electronic Components and Technology Conference, vol. 1, Jun. 1-4, 2004, pp. 1101-1103.

M. Franosch, "Wafer-Level-Package for Bulk Acoustic Wave (BAW) Filters," IEEE Microwaves Symposium, vol. 2, Jun. 6-11, 2004, pp. 493-496.

Young Chul Lee et al., "Monolithic LTCC SiP Transmitter for 60GHz Wireless Communication Terminals," IEEE Microwaves Symposium, Jun. 17, 2005, pp. 1015-1018.

* cited by examiner

*Primary Examiner* — Nitin Parekh (74) *Attorney, Agent, or Firm* — Lando & Anastasi, LLP

(57) ABSTRACT

A method of packaging a semiconductor device that incorporates the formation of cavities about electronic devices during the packaging process. In one example, the device package includes a first substrate having a first recess formed therein, a second substrate having a second recess formed therein, and an electronic device mounted in the first recess. The first and second substrates are joined together with the first and second recesses substantially overlying one another so as to form a cavity around the electronic device.

18 Claims, 9 Drawing Sheets

METHOD FOR WAFER LEVEL PACKAGING OF ELECTRONIC DEVICES

RELATED APPLICATIONS

This application is a division under 35 U.S.C. §120 of U.S. application Ser. No. 12/740,922, titled "WAFER LEVEL PACKAGING USING FLIP CHIP MOUNTING," filed on Apr. 30, 2010, which is herein incorporated by reference in its entirety. U.S. application Ser. No. 12/740,922 is a National Stage application under 35 U.S.C. §371 of International Application PCT/US2008/068106, filed on Jun. 25, 2008, titled "WAFER LEVEL PACKAGING USING FLIP CHIP MOUNTING," which claims priority under 35 U.S.C. §119 to U.S. Provisional Application Ser. No. 60/991,469, titled "WAFER LEVEL PACKAGING USING FLIP CHIP MOUNTING," filed on Nov. 30, 2007.

BACKGROUND

1. Field of Invention

The present invention relates generally to semiconductor devices, and methods for fabricating the same. More particularly, at least some embodiments are directed to flip chip semiconductor packages and packaging processes that incorporate cavities around electronic devices.

2. Discussion of Related Art

Radio frequency integrated circuits (RFICs) are widely used in wireless devices, such as cellular telephones, laptops, personal digital assistants, etc. RFICs combine transmission lines, matching networks, and discrete components, such as inductors, resistors, capacitors, and transistors, on an integration media to provide a subsystem capable of transmitting and receiving high frequency signals, for example, in a range of from about 0.1 to about 100 Gigahertz (GHz). Packaging of RFICs is distinctly different from packaging of more conventional integrated circuits (ICs) due to the fact that the package is often part of the RF circuit, and because the complex RF electrical and/or magnetic fields of the RFIC can interact with any nearby insulators and conductors. To meet growing demands in the wireless industry, RFIC packaging development seeks to provide smaller, lower cost, higher performance devices that can accommodate multi-die RF modules while providing high reliability and using lead-free solder and other "green" materials. The single chip package, in which single- or multi-die RFICs are individually packaged, is a direct solution to the small size and low cost requirements of RFICs, and is currently used for most RFICs.

Micro electromechanical systems (MEMS) enable controlled conversions between micro-scale mechanical motion and specified electrical signals, for example, with specified frequencies. MEMS are becoming widely used in RFICs. Based on mechanical movements, RF MEMS can achieve excellent signal quality factors for RF band filters, including surface acoustic wave (SAW) filters, bulk acoustic wave (BAW) filters, and high frequency RF switches. SAW filters, for example, convert electrical signals into a mechanical wave that is delayed as it propagates across a piezoelectric crystal substrate before being converted back into an electrical signal. BAW filters use volume bulk movement to achieve a specific desired resonance, and in RF switches, electrical signals are used to control movement of a micro-electrode to turn the switch ON or OFF. Current MEMS technologies have evolved from semiconductor fabrication processing. However, the mechanical motion uniquely associated with MEMS demands very different packaging constructions and requirements from conventional semiconductor ICs. In particular, inside all MEMS ICs, some materials must move freely, without interference, and therefore, MEMS ICs are typically "capped" to form a small vacuum or air cavity around the moving materials to protect them while permitting their movements.

One example of a package for an RF MEMS device, developed by Infineon Technologies, AG, Milpitas, Calif., uses a complex passivation structure to create an air cavity around the resonator area of a SAW/BAW filter die. A photolithographic polymer is used to generate a maze structure forming a cavity for each resonator. Reverse wire bonds are used to make the interconnections between the filter die and substrate. A generally flat silicon lid with B-stage adhesive is attached on top of the maze structure to "cap" the ICs and complete the enclosed cavities. This package has been a relatively effective MEMS package as it uses standard die attach and wirebonding assembly technologies. However, it limits package and/or die size reduction, and the additional process steps of maze patterning and lid attachment add considerable complexity and cost to the package, which reduces package efficiency and increases the cost of the overall product in which it is used.

SUMMARY OF INVENTION

At least some aspects and embodiments are directed to a semiconductor package and packaging process that provide the cavities required by MEMS or other devices without the complexity of conventional assembly and packaging processes.

According to one aspect of the present invention there is provided a package for electronic devices. The package may comprise a first substrate comprising a first recess defined in a first surface of the first substrate and a second substrate comprising a second recess defined in a second surface of the second substrate. The first surface of the first substrate is joined to the second surface of the second substrate. The first recess substantially overlies the second recess to define a cavity formed by the first recess and the second recess.

According to one embodiment of the present invention, the first recess coextensively overlies the second recess. According to another embodiment of the present invention, the package further comprises a plurality of additional recesses defined in the second surface of the second substrate, and the first recess substantially overlies the second recess and the plurality of additional recesses. According to a further embodiment of the present invention, the package further comprises a first electronic device disposed within the cavity. The first electronic device may be flip-chip mounted to the first substrate and may comprise a MEMS device. In one example, the first substrate, the second substrate, or both comprise a semiconductor material. In another example, a height of the package is less than about 300 micrometers.

According to another aspect of the present invention there is provided a method of manufacturing a packaged electronic device. The method may comprise forming a first recess in a first substrate, forming a second recess in a second substrate, and attaching the first substrate to the second substrate such that first recess and the second recess substantially overly one another so as to define a cavity.

Still other aspects, embodiments, and advantages of these exemplary aspects and embodiments, are discussed in detail below. Moreover, it is to be understood that both the foregoing information and the following detailed description are merely illustrative examples of various aspects and embodiments, and are intended to provide an overview or framework for understanding the nature and character of the claimed aspects and embodiments. The accompanying drawings are included to provide illustration and a further understanding of the various aspects and embodiments, and are incorporated in and constitute a part of this specification. The drawings, together with the remainder of the specification, serve to explain principles and operations of the described and claimed aspects and embodiments.

BRIEF DESCRIPTION OF DRAWINGS

Various aspects of at least one embodiment are discussed below with reference to the accompanying drawings. In the drawings, which are not intended to be drawn to scale, each identical or nearly identical component that is illustrated in various drawings is represented by a like numeral. For purposes of clarity, not every component may be labeled in every drawing. The drawings are provided for the purposes of illustration and explanation, and are not intended as a definition of the limits of the invention. In the drawings.

DETAILED DESCRIPTION

As discussed above, RFICs comprising MEMS devices can require, or greatly benefit from, a cavity disposed between the MEMS device (or devices) and the substrate. However, conventional methods of packaging devices with cavities require complex assembly processes and/or result in relatively large overall package sizes.

Accordingly, methods of packaging according to embodiments of the present invention may facilitate fast, simple, low-cost production of packaged electronic devices incorporating cavities, with relatively small overall package dimensions. In addition, as discussed further below, multiple devices may be combined in one package to form a packaged module. The use of modules incorporating multiple devices allows for a larger number of devices to be mounted in a given area of a circuit board of a product due to the smaller size of a single module package as compared to two or more individually packaged devices, and may also allow for improved overall product performance and/or lower heat production due to the reduced distance that current must flow between adjacent devices.

It is to be appreciated that embodiments of the methods and apparatuses discussed herein are not limited in application to the details of construction and the arrangement of components set forth in the following description or illustrated in the accompanying drawings. The methods and apparatuses are capable of implementation in other embodiments and of being practiced or of being carried out in various ways. Examples of specific implementations are provided herein for illustrative purposes only and are not intended to be limiting. In particular, acts, elements, and features discussed in connection with any one or more embodiments are not intended to be excluded from a similar role in any other embodiments. Any references to front and back, left and right, top and bottom, and upper and lower are intended for convenience of description, not to limit the present systems and methods or their components to any one positional or spatial orientation. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items. The term "electronic device" is to be understood as encompassing semiconductor die, RF devices, MEMS devices, and other electrical components that may be packaged in a package according to embodiments of the present invention.

Figure 1:
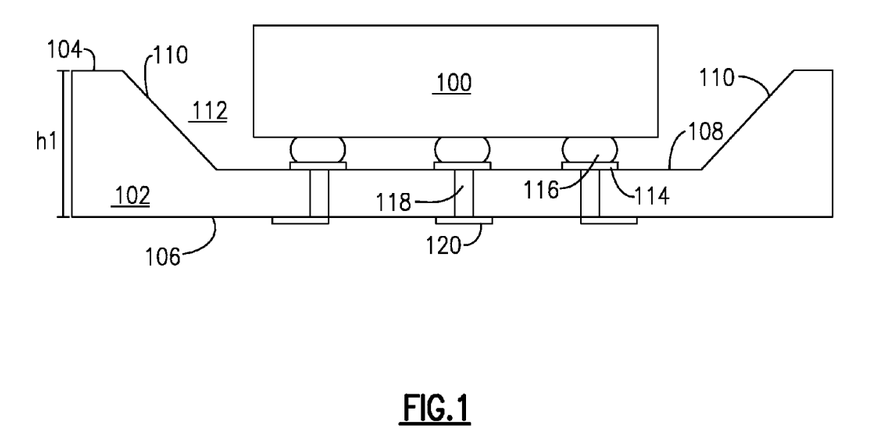
FIG. 1 is a cross-sectional diagram of an RFIC device attached to a base of a device package, according to aspects of the invention.

Referring to FIG. 1, there is illustrated a cross-sectional view of one example of a substrate 102 having an electronic device 100 attached thereto, according to one embodiment of the present invention. The substrate 102 may comprise any suitable material, such as, but not limited to, a semiconductor material, for example, silicon or gallium arsenide (GaAs), glass, and the like. In the illustrated embodiment, substrate 102 has a first surface 104, a second (exterior) surface 106, a recessed surface 108, and tapered surfaces 110 positioned between surfaces 104 and 108. The surfaces 108 and 110 define a base recess 112. The base recess 112 may be formed by a chemical etching process such as those well known in the art of semiconductor device fabrication, and by others, such as, for example, reactive ion etching (RIE), micromachining, etc. It is to be appreciated that the angle of taper of the surfaces 110 may vary depending on the material of the substrate 102, the process used to form the base recess 112, and other factors. Accordingly, the invention is not limited to the example illustrated in FIG. 1. In some embodiments, any or all of the substrate surfaces 104, 106, 108 and 110 may be planar or nearly so. Substrate 102 has a total height, h1.

According to one embodiment, electronic device 100 is attached to bond pads 114 disposed on the recessed surface 108 of the substrate 102, as shown in FIG. 1. The electronic device may be at least partially contained within the base recess 112. In one example, the electronic device 100 may be bonded to the bond pads 114 using a flip chip bonding method, as is widely used for RFICs. However, it is to be appreciated that the invention is not limited to flip chip packaging, and the electronic device may instead be connected to the bond pads 114 using conventional wire bonding or other techniques. As known to those skilled in the art, flip chip mounting includes providing a conductive "bump" 116 placed directly on the surface the electronic device 100. The bumped electronic device 100 is then "flipped over" and placed face down on the substrate 102, with the bumps 116 connecting the electronic device 100 directly to the bond pads 114.

In one example, a standard gold-to-gold interconnect (GGI) bonding process can be used. GGI is a thermosonic process by which gold bumps and gold bond pads are joined together by heat and ultrasonic power under a pressure head, using a machine called a GGI bonder. In this case, the bumps 116 and bond pads 114 are made of gold, or at least gold plated. The thermosonic process connection is made by solid-phase bonding between the two gold layers. Diffusion of gold (micro-welding) under load, and ultrasonic power, creates the gold-to-gold connection as a bond layer that is void-free and monolithic. GGI bonding is a relatively low cost technology, and is also a fluxless bonding method, which is environmentally friendly and minimizes contamination of the devices. In another example of a flip chip bonding method that can be used to bond the electronic device 100 to the substrate 102, the bumps may be copper pillar bumps, and bonding may be achieved using a thermosonic process such as that described in commonly-owned and co-pending U.S. patent application Ser. No. 11/957,730 filed Dec. 17, 2007, entitled "Thermal Mechanical Flip Chip Bonding," (now U.S. Pat. No. 7,642, 135) which is herein incorporated by reference in its entirety.

Still referring to FIG. 1, substrate 102 may also comprise a number of vias 118 which include a metallization providing electrical communication between the bond pads 114 and external contact pads 120. The external contact pads 120 may be used to connect the completed package to an external substrate or printed circuit board, using techniques well known in the art. The vias 118 thus provide a signal path to and from the electronic device 100 contained within the completed package.

Figure 2:
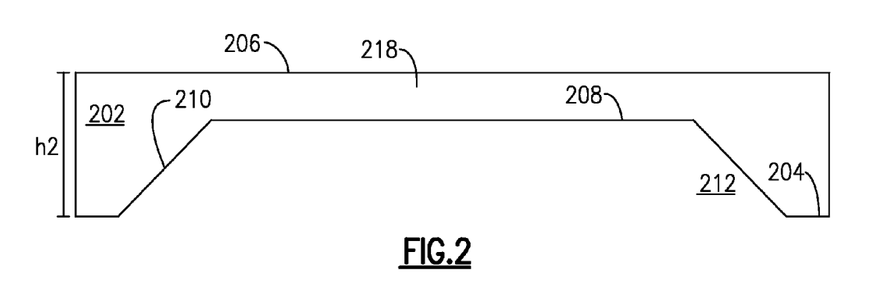
FIG. 2 is a cross-sectional diagram of one example of a cap wafer for a device package, according to aspects of the invention.

Referring to FIG. 2, there is illustrated an example of cap substrate 202 that can be coupled to the substrate 102 to form a device package according to aspects of the invention. Cap substrate 102 may comprise any suitable material such as, for example, a semiconductor material (e.g., silicon or GaAs) or glass. Similar to substrate 102, cap substrate 202 may comprise a first surface 204, a second surface 206, a recessed surface 208, and tapered surfaces 210 between surfaces 204 and 208. The surfaces 208 and 210 define a cap recess 212, which may be formed using any suitable technique, as discussed above with reference to substrate 102. It is to be appreciated that the angle of taper of the surfaces 210 may vary depending on the material of the substrate 202, the process used to form the cap recess 212, and other factors. Accordingly, the invention is not limited to the example illustrated in FIG. 2. Cap substrate 202 has a total height h2.

Figure 3:
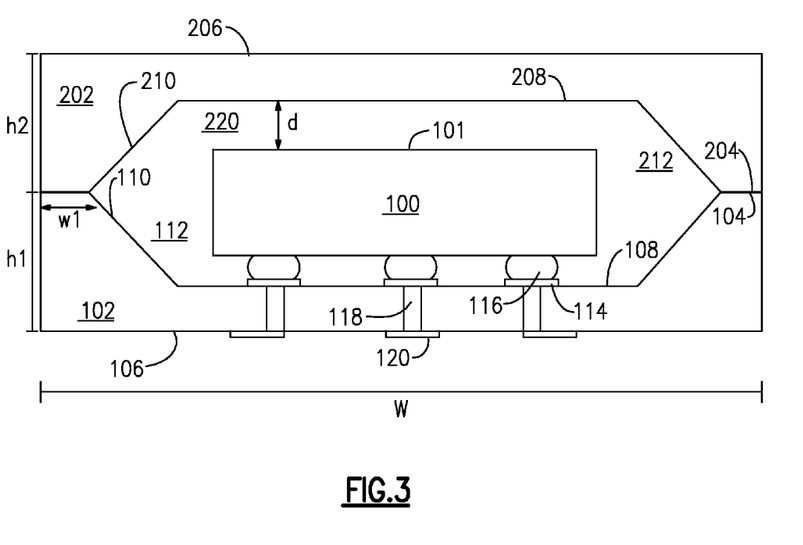
FIG. 3 is a cross-sectional diagram of one example of a device package including a cavity and an RFIC device attached to the base of the cavity, according to aspects of the invention.

According to one embodiment, substrate 202 is attached to substrate 102 to form a package that encloses electronic device 100, as is illustrated in FIG. 3. In one example, substrates 102 and 202 are joined along surfaces 104 and 204 to form a cavity 220 defined by base recess 112 and cap recess 212. The cavity 220 substantially encloses the electronic device 100. The size and depth of the recesses 112, 212 may be controlled to provide a spacing, d, between a surface 101 of device 100 and the cap substrate 202, as illustrated in FIG. 3.

Figure 4:
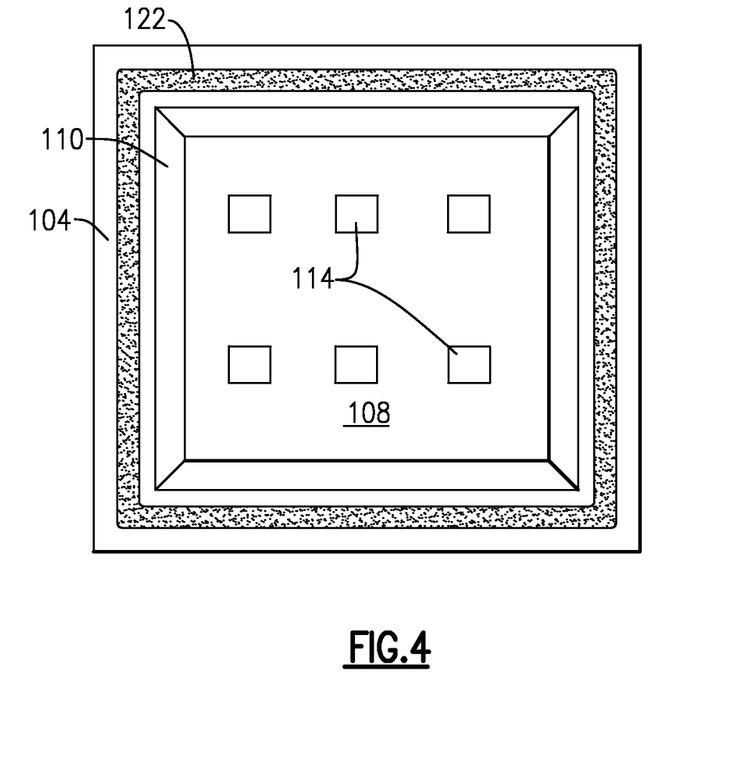
FIG. 4 is a plan view of a base of one example of a device package according to aspects of the invention.

The cap substrate 202 may be joined to base substrate 102 using any suitable bonding procedure and/or adhesive. For example, in one embodiment a layer of bonding material may be disposed on one or both of substrates 102 and 202 to facilitate bonding of the two substrates together. Referring to FIG. 4, there is illustrated a plan view of substrate 102 (without an electronic device disposed thereon) including a layer of bonding material 122 disposed around a perimeter of the base recess 112. Bonding material 122 may comprise any of a number of suitable materials including, for example, glue, solder, gold or other metals, epoxy, etc. Bonding of the cap substrate 202 and the base substrate 102 to one another using any of these materials may be accomplished using methods well known in the art. In another example, bonding material 122 may comprise a layer of glass, in which case base substrate 102 and cap substrate 202 may be joined by an anodic bonding process. Alternatively, anodic bonding may also be used if the cap substrate 202 is formed of glass, Pyrex™, or a similar material, as discussed above.

The utilization of a base substrate 102 and a cap substrate 202, both with recesses formed therein as discussed above, may allow for the formation of a cavity-containing device package with smaller overall length and width dimensions than may be accomplished by using a conventional planar base substrate. This size reduction may be achieved because the height of the electronic device 100 can be accommodated by both recesses 112, 212, as illustrated in FIG. 3. This concept may be better understood with reference to FIGS. 3 and 5a.

Figure 5A:
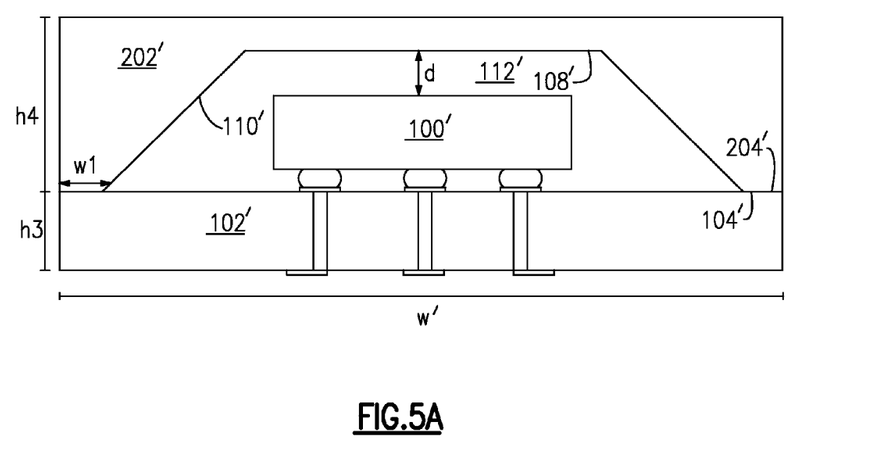
FIG. 5a is a cross-sectional diagram of an example of device package having a planar base substrate and a cap substrate including a recess.

Referring to FIG. 5a, there is illustrated one example of a device package including a planar base substrate 102', and a cap substrate 202' with a recess 112'. The die 100' is of the same dimensions as die 100 illustrated in FIG. 3, and the distance, d, between device 100 and cap substrate 202 in FIG. 3 is the same as that between device 100' and the flat surface 108' of cap substrate 202' in FIG. 5a. Similarly, the width w1 of the surfaces 104 and 104' is the same for the packages illustrated in FIGS. 3 and 5a, and the angle of inclination of the surfaces 110, 110' relative to corresponding surfaces 104, 104' and 108, 108' is also the same for both packages. As can be seen from FIG. 3 and FIG. 5a, for the same given dimensions of the dies and substrates discussed above, the use of a base substrate 102 with a recess, according to aspects of the invention, instead of a conventional planar base substrate 102' may allow for a reduced height, h2, of cap substrate 202 compared to the height, h4, of the cap substrate 202' (i.e., h2<h4). Depending on the height, h3, required for the planar base substrate 102', and the thickness of the "membrane" portion 218 (depicted in FIG. 2) of the cap substrate 202 as well as the corresponding membrane portion of the base substrate 102, the reduction in height, h2, of the cap substrate 202 may result in a decrease in the height of the overall package as well (i.e., in some instances h1+h2<h3+h4). In addition, for any given angle of inclination of surfaces 110, 110' (other than vertical), reducing the height, h2, of the cap substrate 202 results in a decrease in the overall width, W, of the base substrate (i.e., W<W'), and thus of the entire device package.

Figure 5B:
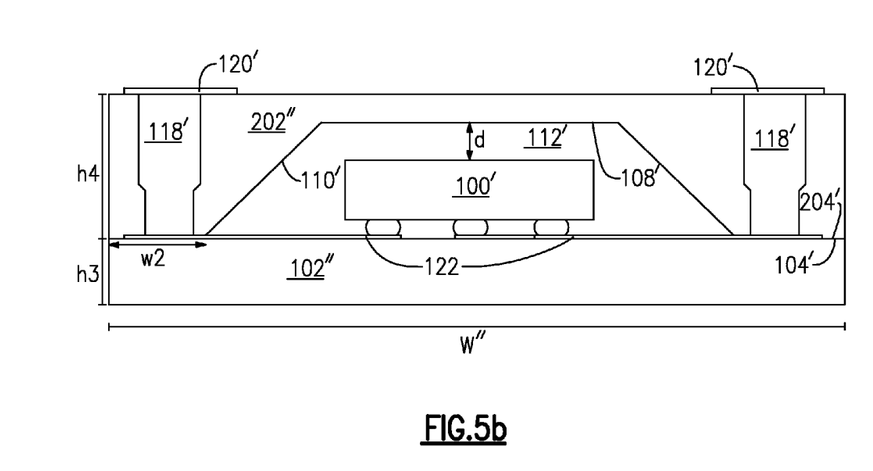
FIG. 5b is a cross-sectional diagram of an example of device package having a planar base substrate and a cap substrate including a recess with vias extending through the cap substrate.

Illustrated in FIG. 5b is an example of a device package similar to that illustrated in FIG. 5a, but where the external electrical contact pads 120' are positioned on the cap substrate 202", rather than on the planar base substrate 102". The external contact pads 120' are in contact with the device 100' by way of vias 118' passing through the cap substrate 202" and by metallization lines 122. It can be observed that for a given device 100' size and distance d between device 100' and cap substrate 202", dimension w2 of FIG. 5b may be increased relative to dimension w1 of FIG. 5a and dimension W" of FIG. 5b may be increased relative to dimension W' of FIG. 5a in order to allow sufficient space for vias 118'. In some examples, the device package of FIG. 5b is thus even larger than that of FIG. 5a for a given die 100' and die-to-cap substrate spacing d.

Thus, the device package including recesses in both the cap and base substrates according to aspects and embodiments of the present invention may provide the advantage of a smaller overall package size verses a comparable package with a planar base or cap substrate. In one example, the height of the device package according to aspects of the invention is less than about 300 micrometers. Furthermore, the package containing the cavity can be manufactured using a simple process flow and well established techniques, without the complexity associated with some conventional cavity-forming processes discussed above.

Figure 6:
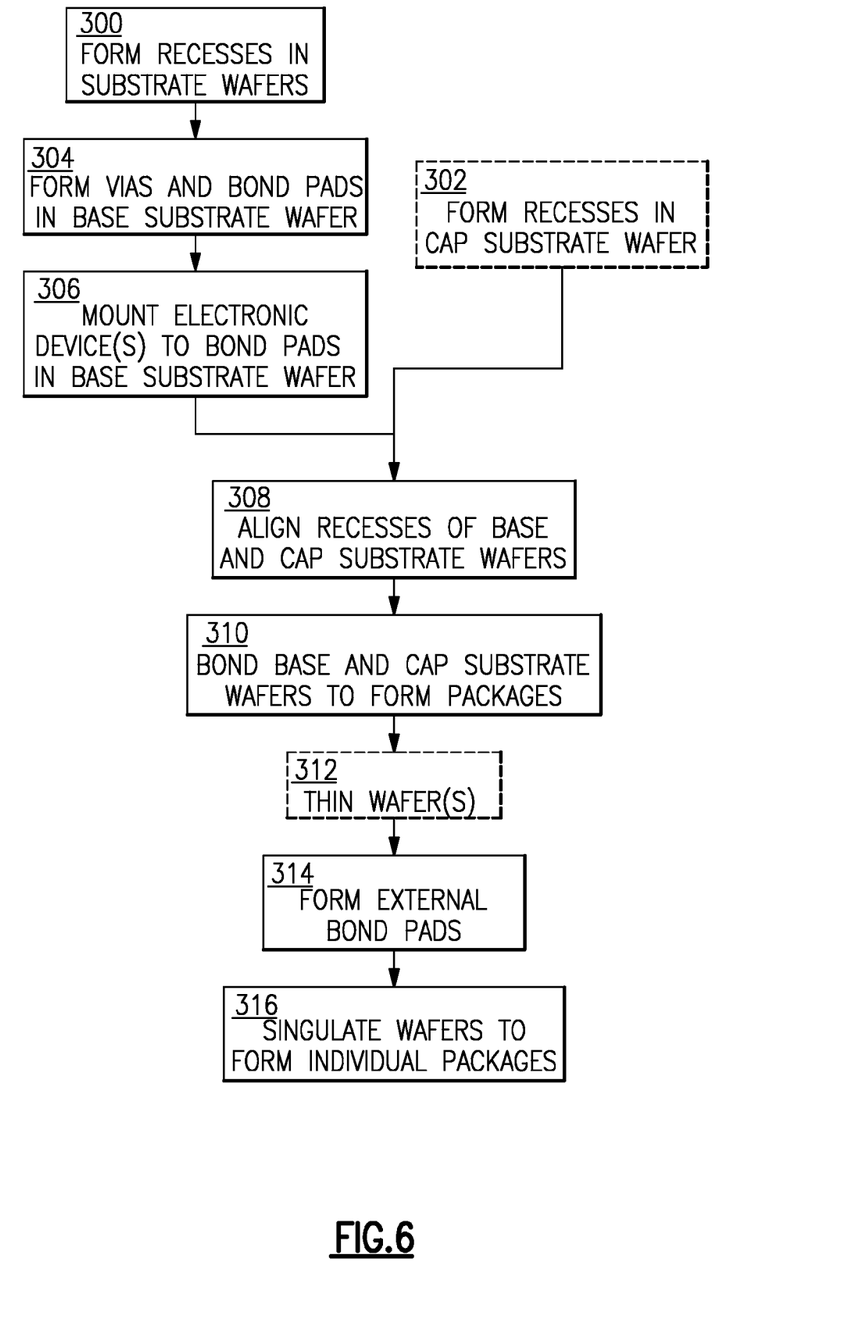
FIG. 6 is a flow chart of one example of a method of producing a device package according to aspects of the invention.

Referring to FIG. 6, there is illustrated a flow diagram of one example of a method of manufacturing a device package incorporating a cavity, according to aspects of the invention. In a first step 300, base recess or recesses 112 may be formed in the substrate 102, using techniques such as, for example, chemical or ion etching, as discussed above. According to one embodiment, processing of the substrate 102 to form the base recess or recesses 112 may be done at the wafer level, rather than at the individual device level. For example, a base substrate wafer, such as a 4 inch (100 mm), 6 inch (150 mm), or 8 inch (200 mm) diameter GaAs or silicon wafer, may be processed in step 300 to form multiple recesses 112. In one example, a mask, such as a photolithographic mask, may be used to define the recess areas on the wafer and therefore, multiple recesses with the same or different dimensions may be formed in a single step 300.

In one embodiment, step 300 may include forming the recesses in both a base substrate wafer and a cap substrate wafer. In some examples, the base substrate 102 and cap substrate 202, and the recesses 112, 212 formed therein, may be substantially identical. Thus, the substrates 102, 202 and recesses 112, 212 may be formed during the same step 300. In one example, the same wafer may be processed and then singulated (step 316) to form multiple base substrates 102 (with base recesses 112) and cap substrates 202 (with cap recesses 212), and the packages may be individually assembled. In other examples, however, it may be currently preferable to perform several process steps (including, for example, attaching the electronic devices 100 to the base substrates 102 and joining the cap substrates 202 to the base substrates 102) at the wafer level. Therefore, it may be currently preferable or convenient to use separate base substrate wafers and cap substrate wafers. Accordingly, in one embodiment, the method of manufacturing the device packages may include a step 302 of forming multiple cap recesses 212 in a cap substrate wafer.

Still referring to FIG. 6, a next step 304 may include further processing the base substrate wafer to form vias 118 and bond pads 114 in the base recesses 112 (see FIG. 1) of the base substrate wafer. An electronic device 100 may then be mounted on the bond pads (step 306) and attached to the bond pads, for example, using one of the flip chip bonding methods discussed above.

Figure 7:
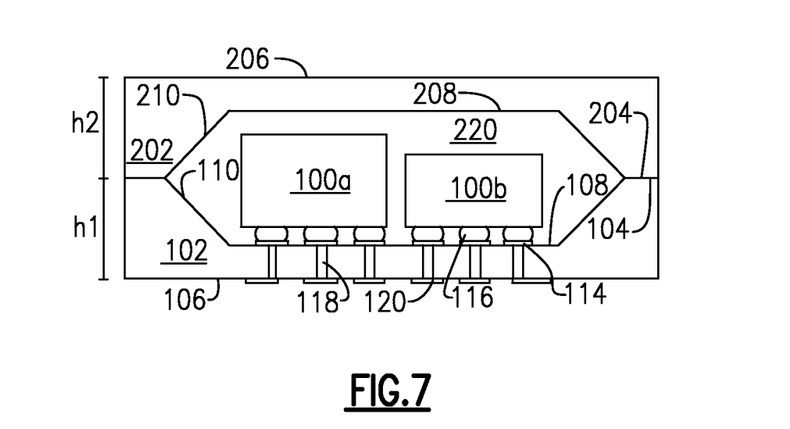
FIG. 7 is a cross-sectional diagram of one example of a pair of RFIC devices mounted in a side by side configuration in the cavity of a device package according to aspects of the invention.
Figure 8:
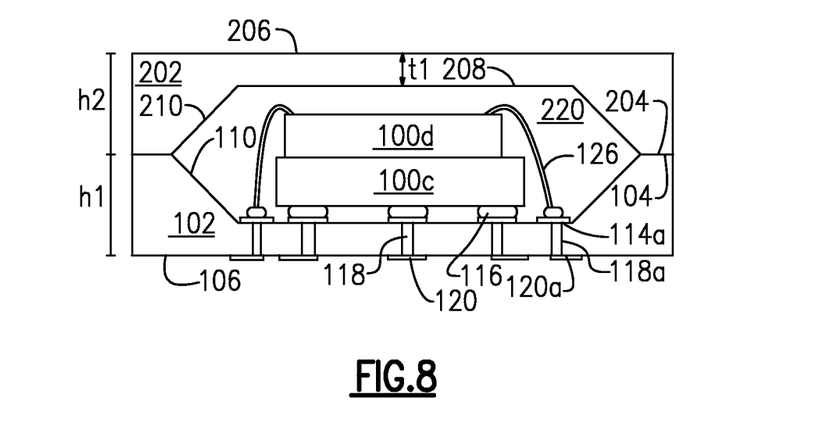
FIG. 8 is a cross-sectional diagram of one example of a pair of RFIC devices mounted in a stacked configuration in the cavity of a device package according to aspects of the invention.

According to one embodiment, more than one electronic device 100 may be incorporated within a single package to provide a multi-functional module. For example, FIG. 7 illustrates a device package including two electronic devices, 100a and 100b, mounted in a side by side configuration in the cavity 220. Although two devices are shown in FIG. 7, it is to be appreciated that the invention is not so limited, and some embodiments may include more than two devices mounted within a single package. In addition, the invention is not limited to mounting the electronic devices 100a, 100b in a side-by-side configuration, and other arrangements are also considered. For example, referring to FIG. 8, there is illustrated another example in which two electronic devices, 100c and 100d, are mounted within a single package in a stacked configuration. In one example, device 100c may be flip chip mounted in the package while device 100d is stacked on device 100c. Device 100d may be wire bonded using wires 126 to electrically connect the device 100d to contacts 114a and vias 118a leading to external pads 120a using wire bonding processes that are well known in the art.

As discussed above, the electronic device(s) mounted within a device package according to various embodiments may include RFICs, MEMS devices such as SAW or BAW filters, pressure sensors or accelerometers, or any of multiple other types of devices known in the art. The devices may be constructed of silicon, gallium arsenide (GaAs), indium phosphide (InP), or other semiconductors or combinations of materials. Combinations of electronic devices formed of different materials may be included in multi-die packages according to some embodiments of the present invention.

In some embodiments, the electronic devices packaged together may be complimentary devices such that a module having more complex functionality may be provided in a single package. Some examples of complimentary devices that may be packaged together include, but are not limited to, an amplifier and a filter, an amplifier and a switch, or the like. Providing complimentary devices together in a single package may have numerous advantages including, for example, allowing for fast communication between the complimentary devices due to their proximity, and eliminating lengths of electrical connections, and their associated potential for heat generation and/or impedance losses, which might otherwise be required to connect the devices. Furthermore, providing a packaged module may simplify the manufacturing process of connecting the packaged devices to a printed circuit board, and may also facilitate production of a smaller overall package than could be provided if the same devices were packaged separately.

Figure 9:
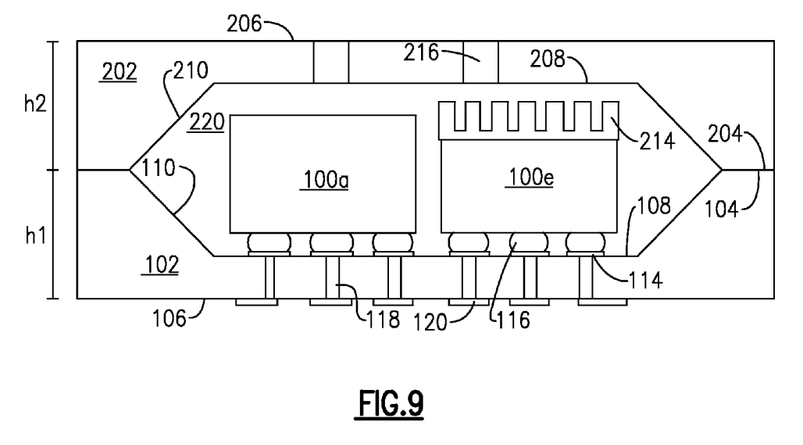
FIG. 9 is a cross-sectional diagram of another example of a pair of RFIC devices mounted in a side by side configuration in the cavity of a device package according to further aspects of the invention.

According to another embodiment, various components and features may also be incorporated into the package along with the electronic device(s) 100. For example, as illustrated in FIG. 9, an electronic device 100e may include cooling fins 214 mounted thereon. These cooling fins may facilitate the removal of heat from a heat generating device, such as, for example, a power amplifier, by providing a greater surface area from which heat may be dissipated by convective cooling. In another example, holes 216 may be provided in base substrate 102 and/or cap substrate 202 in order to allow heat to exit, or air to enter the cavity 220. These holes 216 may be useful in embodiments where electronic devices 100a or 100e may comprise, for example, a pressure sensor or other component which would benefit from being in fluid communication with the atmosphere external to the device package.

Figure 10:
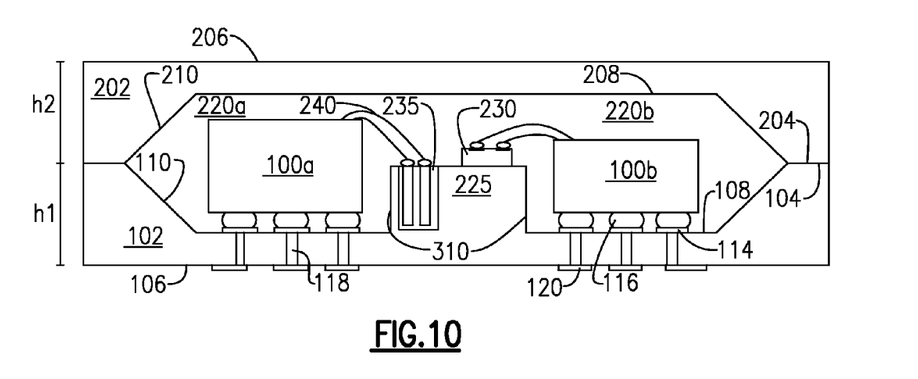
FIG. 10 is a cross-sectional diagram of another example of a pair of RFIC devices mounted in a side by side configuration in two sub-cavities of a device package according to further aspects of the invention.

According to a further embodiment, a package may include two or more cavities sharing a single cavity cap. For example, as illustrated in FIG. 10, a package including multiple devices may be fabricated such that each device 100a and 100b is mounted in separate sub-cavities 220a and 220b respectively. The sub-cavities may be separated by an "island" 225. Additional components may be mounted on island 225, such as component 230 or may be fabricated in island 225, such as component 235. Components 230 and/or 235 may be passive components such as resistors or capacitors, etc., or active components and may be electrically connected to device 100a and/or 100b by, for example, wire bonding utilizing wires 240. Also as illustrated in FIG. 10, sub-cavity walls 310 may be vertically oriented, although they may also be angled at various angles. Each of sidewalls 310 need not be angled at the same angle. The same applies for cavity sidewalls 110 and 210.

As discussed above, one or both of base substrate 102 and cap substrate 202 may comprise a semiconductor material, such as, for example, silicon. In such examples, the semiconductor material may be doped with electrically active dopant species, such as, for example, boron or phosphorous, using techniques well known in the art. The addition of electrically active dopant species to the semiconductor material may increase the conductivity of the material. Providing an at least partially conductive package may have the advantage that the package itself may function as a Faraday cage to retard the propagation of electromagnetic interference into the interior of the package where this interference might otherwise disrupt the operation of electronic devices mounted therein. In another embodiment, a similar result may be achieved by forming a metallization layer (not shown) on any one or more of surfaces 108, 110, 208, and 210 within the cavity 220. This metallization layer may substantially cover the interior surface of the cavity 220, and thus similarly act as a shield against electromagnetic interference.

The optional provision of these or other additional components or features in the device package may be incorporated into the method of manufacturing the device package in any of steps 302, 304 and 306 discussed above with reference to FIG. 6. For example, processing the base substrate wafer and/or cap substrate wafer (steps 302 and 304) may include any additional processing needed to add features such as metallization layers, holes 216, etc. Similarly, step 306 of mounting electronic devices 100 within the recesses 112 of the base substrates 102 may also include positioning and connecting any additional components, such as, for example, the cooling fins 214 discussed above. It is to be appreciated that process flow illustrated in FIG. 6 may also be modified to include additional steps to provide such features or components, as would be recognized by those skilled in the art.

Referring again to FIG. 6, after the electronic device(s) 100, and any other components have been mounted and connected on the base substrate 102, the cap substrate 202 may be joined to the base substrate 102 (steps 308 and 310), as discussed above, to complete the cavity 220 and form the device package. In one example, a bonding process may be selected to achieve hermetic sealing of the cavity 220. In another example, the cavity may comprise a vacuum, or alternatively, may be filled with a gas, a passivation such as an oxide, or a polymer such as SU8. The joining of the cap substrate 202 to the base substrate 102 may be done individually for each package or at the wafer level. Thus, as illustrated in FIG. 6, in one example, the method of manufacturing the device package includes step 308 of aligning the cap substrate wafer with the base substrate wafer, which may be achieved using, for example, alignment marks provided on the wafers, or other techniques known to those skilled in the art. The two wafers may then be joined together (step 310) using any of the techniques that have been described above, or other techniques known to those of skill in the art. Wafer level joining of the cap substrate 202 to the base substrate 102 may have several advantages over assembling each package individually, such as increased assembly speed, reduced cost and a more easily scalable manufacturing process.

According to one embodiment, the height, h1, of the base substrate 102, and/or height, h2, of the cap substrate 202 may be reduced prior to or subsequent to the joining of the base substrate 102 to the cap substrate 202. Again, this height reduction, or "wafer thinning" may be done for each individual packaged device, or at the wafer level. Wafer thinning (step 312) may be done using techniques known in the art such as, for example, wafer backgrinding. It is to be appreciated that step 312 may include thinning of either or both of the base substrate wafer and the cap substrate wafer. In one example, the cap substrate wafer may be thinned such that a thickness, t1 (see FIG. 8), of a layer defined by surfaces 206 and 208 (also referred to as a "membrane") may be less than about 60 micrometers. Reduction in the thickness of the base and/or cap substrates may be beneficial should a device package with a small overall height be desired, for example, for inclusion in an ultra-thin laptop or cell phone. However, the thickness of the substrates should be sufficient to provide adequate mechanical strength to ensure the mechanical integrity of the package.

Still referring to FIG. 6, as discussed above, in one example, external bond pads may be provided (step 314) to allow connection of the device package to an external substrate or printed circuit board. In one example, the device package may be a land grid array package and step 314 may include providing a plurality of conductive pads. In another example, the device package may be a ball grid array package and step 314 may include forming a plurality of conductive pads and attaching a corresponding plurality of solder balls to the conductive pads, to provide the ball grid array.

It is to be appreciated that embodiments of a method of manufacturing a device package according to the present invention are not limited to the process flow illustrated in FIG. 6. Rather, the steps may be performed in an order different from that illustrated, and steps may be added or removed from the method. For example, as discussed above, any of the processing and assembly steps may be done at the individual device level or at the wafer level, and step 316 of singulating the base substrate and cap substrate wafers may be done at any point in the process flow, as appropriate.

It is further to be appreciated that the embodiments of the electronic package illustrated in the figures and described above may be modified, as would be understood by one skilled in the art. For example, although several figures illustrate a package with the base substrate 102 and cap substrate 202 having recesses 112, 212, respectively, that are substantially equally sized and which substantially coextensively overlay one another, the invention is not so limited. In some embodiments the two recesses 112, 212 may be of different sizes from one another, and/or may be of different overall shapes from those illustrated in the figures. For example, one of the substrates and/or recesses may be larger (e.g. wider or deeper) than the other. Some factors that may play a role in sizing the different substrates may include the material or materials from which the substrates may be formed, the requirements for providing different amounts of mechanical strength, and/or the capabilities of the manufacturing process for the substrates.

Having thus described several aspects of at least one embodiment of this invention, it is to be appreciated various alterations, modifications, and improvements will readily occur to those skilled in the art. Such alterations, modifications, and improvements are intended to be part of this disclosure, and are intended to be within the scope of the invention. Accordingly, the foregoing description and drawings are by way of example only.

The invention claimed is:

1. A method of manufacturing an electronic device package comprising:
   forming a first recess in a first semiconductor material substrate;
   forming a second recess in a second semiconductor material substrate;
   attaching the first substrate to the second substrate such that the first recess substantially overlies the second recess so as to define a cavity formed by the first recess and the second recess;
   mounting a flip chip electronic device in the second recess;
   forming one or more electrically conductive vias through the second substrate; and
   bonding the flip chip device to the one or more electrically conductive vias.

2. The method of claim 1 wherein attaching the first substrate to the second substrate includes aligning the first substrate and the second substrate such that the electronic device is enclosed within the cavity.

3. The method of claim 2 wherein mounting the electronic device in the second recess includes flip-chip mounting the electronic device in the second recess.

4. The method of claim 2 further comprising mounting at least one additional electronic device in the second recess.

5. The method of claim 1 further comprising forming one or more holes in one of the first substrate and the second substrate to fluidly connect the electronic device with atmosphere external to the package.

6. The method of claim 1 further comprising doping the semiconductor material of the first substrate and the semiconductor material of the second substrate with electrically active dopant species to permit the package to function as a Faraday cage and retard propagation of electromagnetic interference into an interior of the package.

7. The method of claim 1 further comprising wire bonding the electronic device to one or more bond pads of the package.

8. The method of claim 1 wherein attaching the first substrate to the second substrate includes bonding the first substrate to the second substrate with an adhesive.

9. The method of claim 1 wherein attaching the first substrate to the second substrate includes anodically bonding the first substrate to the second substrate.

10. The method of claim 1 wherein forming the first recess includes forming a plurality of first recesses in a first substrate wafer and forming the second recess includes forming a plurality of second recesses in a second substrate wafer.

11. The method of claim 10 wherein attaching the first substrate to the second substrate includes attaching the first substrate wafer to the second substrate wafer.

12. The method of claim 11 further comprising mounting a respective one of a plurality of electronic devices in each of the plurality of first recesses.

13. The method of claim 11 further comprising thinning one of the first substrate wafer and the second substrate wafer subsequent to attaching the first substrate wafer to the second substrate wafer.

14. The method of claim 11 further comprising singulating the attached first substrate wafer and second substrate wafer to provide a plurality of individual device packages.

15. The method of claim 1 further comprising:
   forming at least one additional recess in the second surface of the second substrate; and
   attaching the first substrate to the second substrate such that the first recess substantially overlies the second recess and the at least one additional recess.

16. The method of claim 15 further comprising:
   mounting a first electronic device in the second recess; and
   mounting a second electronic device in the at least one additional recess.

17. The method of claim 16 further comprising electrically connecting the first electronic device to the second electronic device.

18. The method of claim 1 further comprising forming an electrical component in one of the first substrate and the second substrate.

* * * * *